(12) United States Patent
Kim et al.

(10) Patent No.: US 6,946,328 B2
(45) Date of Patent: Sep. 20, 2005

(54) METHOD FOR MANUFACTURING SEMICONDUCTOR DEVICES

(75) Inventors: Pyoung-Wan Kim, Cheonan (KR); Tae-Sung Yoon, Cheonan (KR); Hyeon Hwang, Cheonan (KR)

(73) Assignee: Samsung Electronics Co. Ltd., Gyeonggi-do (KR)

( * ) Notice: Subject to any disclaimer, the term of this patent is extended or adjusted under 35 U.S.C. 154(b) by 0 days.

(21) Appl. No.: 10/866,662

(22) Filed: Jun. 15, 2004

(65) Prior Publication Data

US 2005/0037537 A1 Feb. 17, 2005

(30) Foreign Application Priority Data

Aug. 11, 2003 (KR) .................... 10-2003-0055396

(51) Int. Cl.⁷ .................................................. H01L 21/44
(52) U.S. Cl. .......................... 438/114; 438/118; 438/465
(58) Field of Search ......................... 438/114, 118, 438/459, 465, 617, 977

(56) References Cited

U.S. PATENT DOCUMENTS

| | | | |
|---|---|---|---|
| 5,864,174 A | * | 1/1999 | Yamada et al. ............. 257/676 |
| 5,879,964 A | * | 3/1999 | Paik et al. ................... 438/113 |
| 6,251,707 B1 | * | 6/2001 | Bernier et al. .............. 438/122 |
| 6,667,191 B1 | * | 12/2003 | McLellan et al. ........... 438/121 |
| 2001/0003016 A1 | | 6/2001 | Pan et al. |
| 2002/0171129 A1 | | 11/2002 | Huang et al. |

FOREIGN PATENT DOCUMENTS

| | | |
|---|---|---|
| JP | 63-37612 A | 2/1988 |
| JP | 63-289822 A | 11/1988 |
| JP | 64-019735 A | 1/1989 |
| JP | 2000-104040 A | 4/2000 |
| JP | 2000-133638 A | 5/2000 |
| JP | 2001-093863 A | 4/2001 |
| KR | 1997-0077603 A | 12/1997 |
| KR | 1998-0012311 A | 4/1998 |
| KR | 10-0218634 B1 | 6/1999 |
| KR | 2002-0049720 A | 6/2002 |
| KR | 2002-0089123 A | 11/2002 |
| KR | 10-0369394 A | 1/2003 |

* cited by examiner

Primary Examiner—Chandra Chaudhari
(74) Attorney, Agent, or Firm—Dickey & Pierce, P.L.C.

(57) ABSTRACT

A method for manufacturing semiconductor devices is provided in which an organic adhesive layer is formed on the backside of a semiconductor wafer after being thinned by a backlapping process and cured to form a B-stage adhesive layer. Using the B-stage adhesive layer, the semiconductor device may then be attached to a circuit substrate and then subjected to additional curing to form a C-stage adhesive layer. Such semiconductor devices may also be attached directly to a lower semiconductor chip or, in the alternative, may be attached to a spacer mounted that is or will be mounted on a lower semiconductor chip or the circuit substrate. The organic adhesive is selected to counteract stresses induced by a passivation layer formed on the active surface, thereby reducing or preventing warping of the semiconductor wafer and eliminating the need for a separate resin paste adhesive during the chip attaching process.

20 Claims, 8 Drawing Sheets

METHOD FOR MANUFACTURING SEMICONDUCTOR DEVICES

CROSS REFERENCE TO RELATED APPLICATIONS

This U.S. non-provisional application claims priority under 35 U.S.C. § 119 to Korean Patent Application No. 2003-55396, which was filed Aug. 11, 2003, the contents of which are incorporated by reference in their entirety.

BACKGROUND OF THE INVENTION

1. Field of the Invention

The present invention relates to a method for manufacturing semiconductor devices and, more particularly, to a method for separating individual semiconductor chips from a semiconductor wafer and mounting such semiconductor chips in a semiconductor device package.

2. Description of the Related Art

Generally, a conventional semiconductor device fabrication process concludes with sawing, chip attaching, wire-bonding and molding processes. The sawing process is typically utilized to saw through predetermined portions of a semiconductor wafer to divide it into individual semiconductor chips. The chip attaching process will then typically separate the individual semiconductor chips and frequently attach them to a circuit substrate. The wire-bonding process is then typically used to form electrical connections between conductive regions on the individual semiconductor chips and corresponding conductive regions on the circuit substrate using a series of conductive bonding wires. The molding process will then typically be used to encapsulate the semiconductor chips, the bonding wires and a portion of the circuit substrate with a resin molding material to protect them from the external environment.

Semiconductor chips are conventionally attached to a circuit substrate using an adhesive that is applied to a mounting portion of the circuit substrate after which the semiconductor chip is pressed onto the adhesive covered portion of the circuit substrate. The adhesive may be a resin paste adhesive such as an Ag-epoxy adhesive and may be applied to the circuit substrate by a number of methods including, for example, stamping, dispensing or screen printing methods. Of the various methods, the dispensing method is still perhaps the most commonly used method for conventional attachment.

In the dispensing method the resin paste adhesive is typically stored in a syringe and then is discharged in controlled amounts onto a predetermined region of the circuit substrate by the dispenser mechanism. However, in instances in which the size of the semiconductor chip is relatively large, the dispensing method is more likely to experience difficulties in applying a uniform thickness of the resin paste adhesive on the predetermined region of the circuit substrate. In addition, voids may occur in an adhesive layer of the resin paste adhesive during the curing process that typically follows the chip attaching process.

Attempts to address these difficulties have included the method disclosed in Japanese Patent Laid-Open Nos. 63-289822 and 1-19735 in which an adhesive film is utilized to attach the semiconductor chip to the circuit substrate. This method, however, tends to introduce its own complications including, for example, the need to cut the adhesive film to correspond to the size of the semiconductor chip and the need for additional apparatus for arranging and attaching the cut film to the semiconductor chip.

An attempt to improve upon the initial adhesive film methods is disclosed in Japanese Patent Laid-Open No. 2000-104040 in which an adhesive tape is attached to the backside of a backlapped semiconductor wafer, typically by using a heat-compression method. The semiconductor wafer, which the attached adhesive tape, is then attached to a sawing tape and sawn to separated the semiconductor wafer into the individual semiconductor chips each of which includes a corresponding portion of the adhesive tape. The individual semiconductor chips and the portions of the adhesive tape provided on their backside may then be separated from the sawing tape and attached to a circuit substrate.

The heat-compression process used to attach the adhesive tape to the semiconductor wafer typically uses a combination of a press roller and a heat plate to heat the adhesive tape and press it against the backside surface of the semiconductor wafer. However, the risk of damage to the semiconductor wafer resulting from the thermal and mechanical stresses applied to the semiconductor wafer during the heat-compression method will tend to increase as the semiconductor wafer thickness is reduced and/or the semiconductor wafer diameter is increased. As a result, larger and/or thinner semiconductor wafers are more likely to be bent, warped or cracked when attached using the heat-compression method, rendering this technique is less suitable for such wafers. These complications associated with the heat-compression technique are only being exacerbated by the continuing trend toward thinner and smaller semiconductor devices formed on increasingly larger semiconductor wafers.

The semiconductor wafer may be formed in the shape of a disc with a thickness of as much as 700 $\mu$m or more to provide the mechanical strength necessary to survive the handling during the fabrication process. After the fabrication process has formed the semiconductor device structures, a passivation layer of predetermined thickness is typically formed on the active surface of the semiconductor wafer to protect the integrated circuits and may be formed from an inorganic insulator such as nitride or a polymeric material such as polyimide.

The coefficient of thermal expansion (CTE) of polyimide is, however, larger than the CTE of silicon so when a polyimide layer covering the active surface of the semiconductor wafer is cured, the polyimide may shrink and tend to warp the semiconductor wafer. When the semiconductor wafer is 700 $\mu$m thick, the silicon will tend to have sufficient stiffness to limit the extent of the warping, but when the thickness of the semiconductor wafer is reduced by backlapping, backgrinding or polishing prior to assembly, the extent of the warp will tend to increase. For example, if a 200 mm diameter semiconductor wafer is backlapped to a thickness of 200 $\mu$m or less, or a 300 mm diameter semiconductor wafer is backlapped to a thickness of 400 $\mu$m or less, the likelihood that a semiconductor wafer having a polyimide passivation layer formed on the active surface will warp increases and that the degree of the warp will be large enough to complicate or prevent the successful completion of subsequent semiconductor device manufacturing processes.

A method intended to reduce or to prevent warping of semiconductor wafers having a polyimide film or a metal film formed on the backside surface is disclosed in Korean Patent Laid-Open No. 2002-049720 and Japanese Patent Laid-Open Nos. 2000-133638 and 2001-093863. The disclosed method utilizes an additional resin paste adhesive during the semiconductor chip attaching process. Although the disclosed method may be successful in reducing or preventing the warping of a semiconductor wafer, it does not address or overcome the other problems associated with the use of the resin paste adhesive.

SUMMARY OF THE INVENTION

The present invention provides a method for manufacturing semiconductor devices in which a semiconductor wafer has an adhesive layer formed on the backside after completion of a backlapping process, thereby reducing or preventing any warping of the semiconductor wafer and reducing or eliminating the need to apply a resin paste adhesive during a semiconductor chip attaching process.

An exemplary embodiment of the method for manufacturing semiconductor devices according to the invention begins by preparing a semiconductor wafer having a plurality of semiconductor devices formed on an active surface and then reducing the thickness of the semiconductor wafer by backlapping or backgrinding the backside surface. An organic adhesive is then applied to the backside surface of the semiconductor wafer and cured to form a B-stage adhesive layer. The semiconductor wafer having the backside B-stage adhesive layer is then attached to a sawing tape and sawn to divide the semiconductor wafer into individual semiconductor chips. The individual semiconductor chips having a B-stage adhesive layer on their backside are then separated from the semiconductor wafer and attached to circuit substrates. The circuit substrates having one or more semiconductor chips attached are then subjected to a thermal treatment, typically in an oven, during which the B-stage adhesive layer is cured to form a C-stage adhesive layer and complete the attachment of the semiconductor device(s) to the circuit substrate.

According to exemplary embodiments of the method, a semiconductor wafer having a diameter of 200 mm may be backlapped to a thickness of 200 μm or less while a semiconductor wafer having a diameter of 300 mm may be backlapped to a thickness of 400 μm or less. The organic adhesive may be selected from a group consisting of epoxy, acryl, polyimide, silicone, epoxy/acryl, epoxy/polyimide, epoxy/silicone, acryl/polyimide, polyimide/silicone and epoxy/polyimide/silicone and may have a viscosity of between about 20 to 30 poise.

The B-stage adhesive layer may be formed on the backside of the semiconductor wafer by spin coating, printing, injection molding or compression molding methods. The B-stage curing process may proceed at a temperature of between about 100° C. and 150° C. for between about 20 to 30 minutes. The B-stage adhesive layer may be alternatively formed by exposing the B-stage adhesive to ultraviolet rays of sufficient intensity. As formed, the B-stage adhesive layer may have an average thickness of between about 30 μm and 50 μm.

The C-stage curing process may be conducted at a somewhat higher temperature than the B-stage curing process utilizing a temperature range of about 150° C. to 200° C. for between about 30 to 60 minutes to achieve the desired transition from B-stage to C-stage curing of the adhesive layer. After the C-stage curing process, a spacer may be attached on the semiconductor chip. A new semiconductor chip having a B-stage adhesive layer may then be stacked on the spacer by heat compression.

For embodiments including more than one semiconductor chip, after the C-stage curing process has been completed to attach a first semiconductor chip to the circuit substrate, a second semiconductor chip on which a B-stage adhesive layer has been formed may be stacked on the first semiconductor chip by heat compression. In such applications, the second semiconductor chip will typically be somewhat smaller that the first semiconductor chip so that it may be mounted within the periphery of the first semiconductor chip.

BRIEF DESCRIPTION OF THE DRAWINGS

The features and advantages of the present invention will be readily understood in light of the following detailed description, particularly when considered in conjunction with the accompanying drawings. In these drawings, which are not drawn to scale and in which various elements may be simplified, enlarged, reduced or rearranged, the same reference numerals are used to designate similar or corresponding structural elements, and in which:

FIGS. 2 through 10 are views illustrating various of the process steps included in an exemplary method for manufacturing semiconductor devices according to the invention in which;

FIG. 2 is a plan view of a wafer;

FIG. 3 is a partially enlarged view of a semiconductor chip of FIG. 2;

FIG. 4 is a cross-sectional view illustrating the process step of backlapping the backside of the semiconductor wafer;

FIG. 5 is a cross-sectional view illustrating a step of forming a B-stage adhesive layer on the backside of the semiconductor wafer;

FIG. 6 is a cross-sectional view illustrating a step of dividing the semiconductor wafer into individual semiconductor chips;

FIG. 7 is a cross-sectional view illustrating a step of attaching an individual semiconductor chip to a circuit substrate;

FIG. 8 is a cross-sectional view illustrating a semiconductor chip mounted on a circuit substrate after wire-bonding;

FIG. 9 is a cross-sectional view illustrating a step of forming a resin encapsulant;

FIG. 10 is a cross-sectional view illustrating a step of forming solder balls on the circuit substrate;

FIG. 13A, or completely, FIG. 13B.

DETAILED DESCRIPTION OF EXEMPLARY EMBODIMENTS

Figure 1:
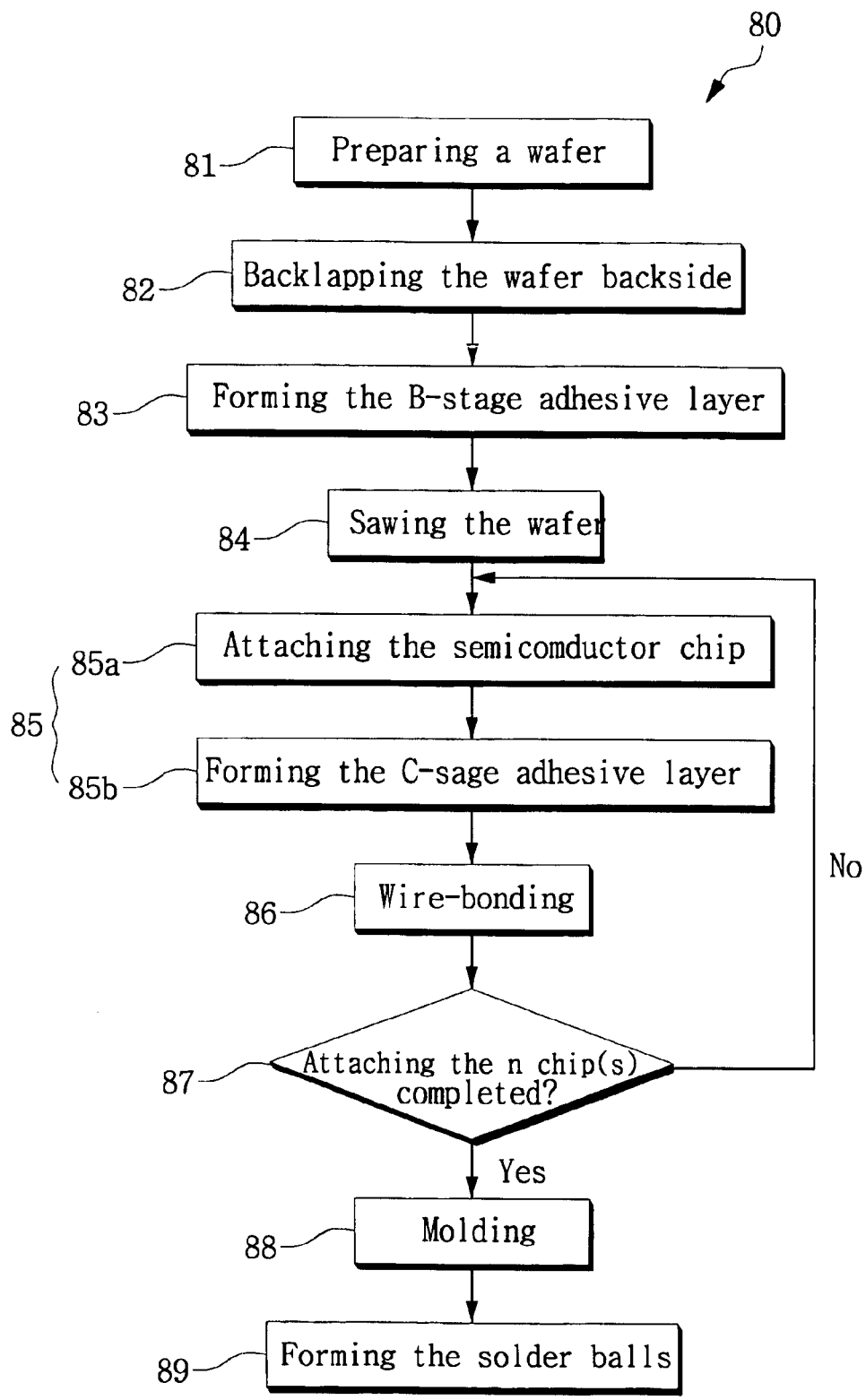
FIG. 1 is a flow chart of a method for manufacturing semiconductor devices in accordance with an exemplary embodiment of the present invention.

Exemplary embodiments of the present invention are described below with reference to the accompanying drawings in which FIG. 1 is a flow chart 80 indicating certain of the steps included in a method for manufacturing semiconductor devices in accordance with an exemplary embodiment of the present invention. FIGS. 2 through 10 are provided to further illustrate certain of the steps of the method for manufacturing semiconductor devices listed in FIG. 1.

Figure 2:
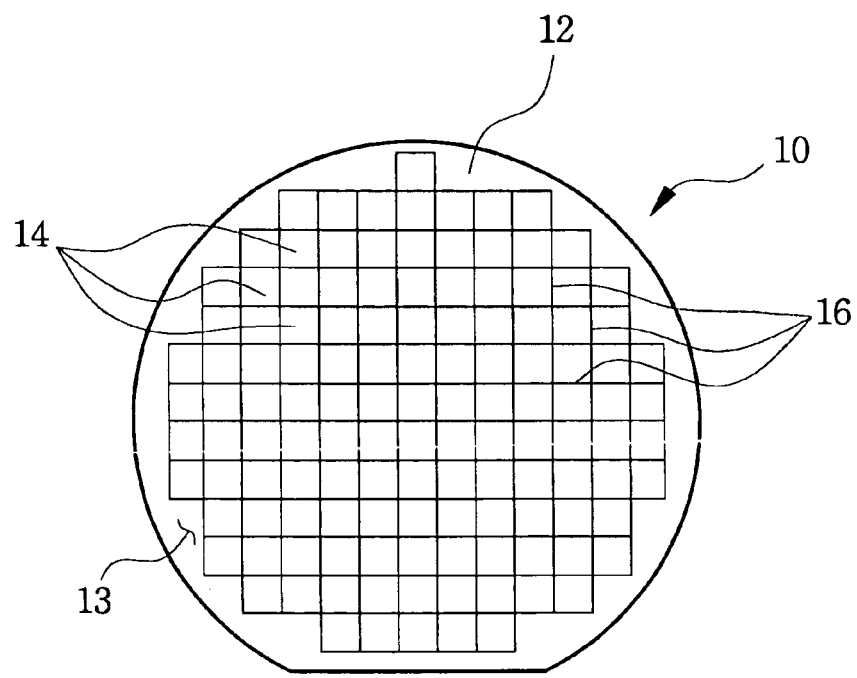
Figure 3:
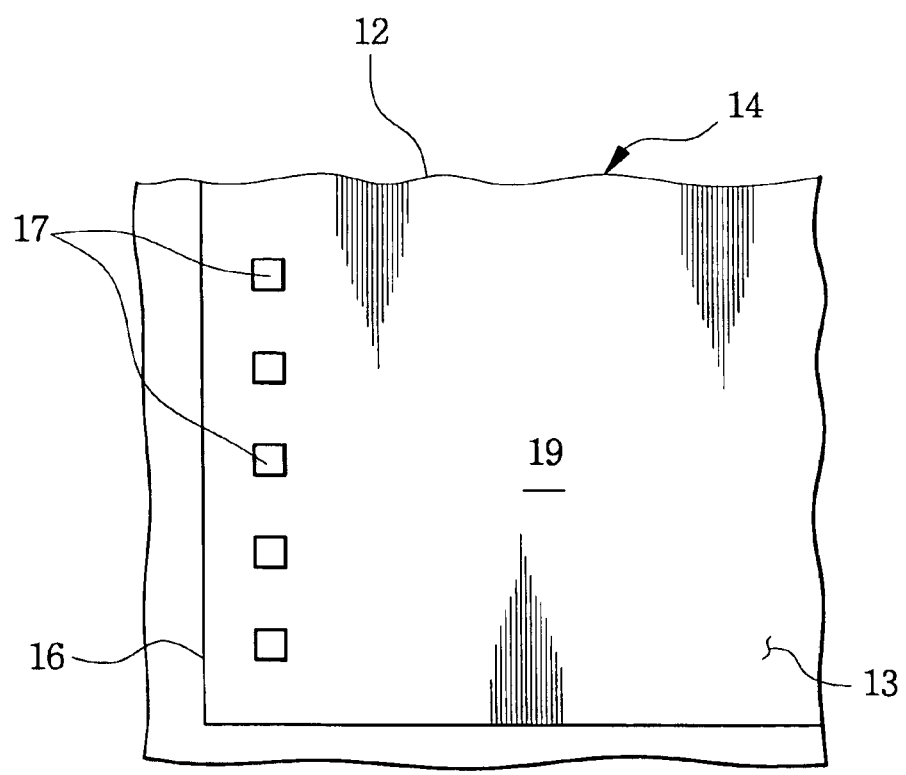

A method for manufacturing semiconductor devices according to the exemplary embodiments of the invention will typically begin by preparing a semiconductor wafer 10 (step 81 of FIG. 1) using one of a variety of front-end processes to produce a semiconductor wafer on which a number of semiconductor chips are formed. As illustrated in FIGS. 2 and 3, the semiconductor chips 14 or integrated circuits (ICs) are manufactured on a major surface of the silicon substrate 12. Adjacent semiconductor chips 14 are separated from one another by a series of scribe lines 16. In order to tolerate the handling and mechanical stresses to which the semiconductor wafer 10 is exposed during the manufacture of the semiconductor chips 14, the thickness of the semiconductor wafer, which may typically have a diameter on the order of 200 to 300 mm or more, may be on the order of 700 $\mu$m or more, with the thickness tending to increase as the diameter of the semiconductor wafers increases. Because the present invention is generally independent of the specific structure and functionality of the semiconductor chips 14, they are illustrated in a substantially simplified form. Those of ordinary skill will, of course, appreciate that the semiconductor chips may include highly complex structures and functionality.

Each of the semiconductor chips 14 includes chip pads 17 that are electrically connected to the ICs formed on the interior portion of the semiconductor chip. A passivation layer 19 is typically provided to cover and protect the active surface 13 of the silicon substrate 12 and, typically, peripheral portions of the chip pads 17. The chip pads 17 are commonly formed from aluminum (Al) or a combination of several conductive layers that may include aluminum or an aluminum alloy. The passivation layer 19 may be made of polyimide and may be between about 3 $\mu$m and 10 $\mu$m thick. Although the chip pads 17 may be arranged along the edges of the semiconductor chip 14, other configuration in which some or all of the chip pads 17 are arranged on more central portions of the semiconductor chip and may be organized in one or more lines, array or grid formations.

Figure 4:
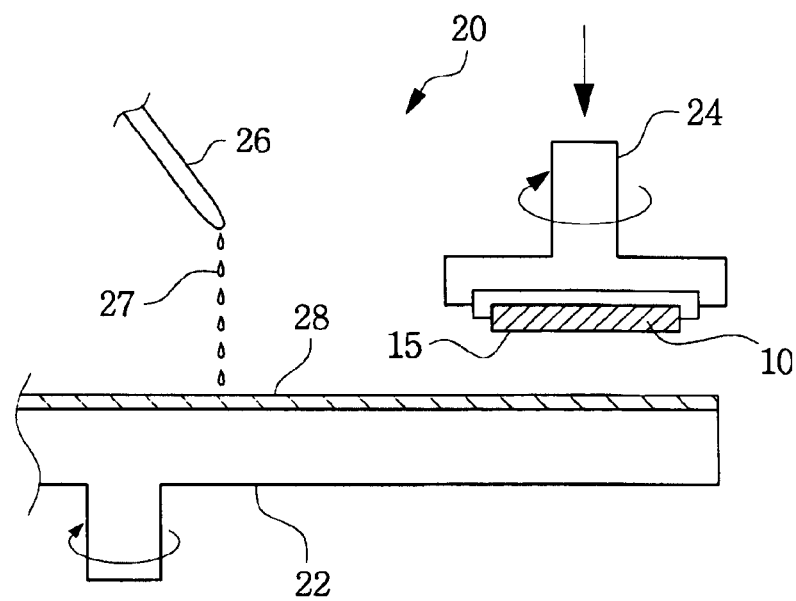

Referring to FIG. 4, the semiconductor wafer backside 15 is backlapped (also referred to as backgrinding) to remove a portion of the semiconductor wafer (step 82 of FIG. 1) to reach a target thickness for the semiconductor chips 14 that will be separated from the semiconductor wafer. The backlapping process may employ one or more methods including, for example, chemical mechanical polishing (CMP), grinding, wet etching or dry etching methods.

The CMP method is perhaps the most commonly used. In a conventional CMP method wafer carrier 24 grips the semiconductor wafer 10 with the semiconductor wafer oriented such that the semiconductor wafer backside 15 faces and is generally parallel to a polishing table 22. The semiconductor wafer carrier 24 typically advances the semiconductor wafer 10 toward the polishing table 22 until the semiconductor wafer backside 15 comes in contact with a polishing pad 28 of the polishing table 22 and presses the semiconductor wafer against the polishing pad with a predetermined downforce. A polishing slurry 27 is applied to the polishing surface 28 of a polishing material provided on polishing table 22 through a slurry providing unit 26 while the semiconductor wafer 10 is moved relative to the polishing table. The composition of the polishing slurry 27 may be selected to react with the material found on the semiconductor wafer backside 15 to increase the polishing rate and/or may include abrasive particles that will act with the polishing surface mechanically remove a portion of the semiconductor wafer carrier 24.

During the backlapping process, wafers having a diameter of 200 mm may be backlapped to a thickness of 200 $\mu$m or less while wafers having a diameter of 300 mm may be backlapped to a thickness of 400 $\mu$m or less. In any event, the backlapping process will typically be selected to produce a semiconductor wafer having sufficient mechanical strength to survive the subsequent processing while still being relatively thin to decrease package sizing and conductivity. Indeed, in some instances, the semiconductor wafers may be backlapped to a thickness of 100 $\mu$m or less.

Figure 5:
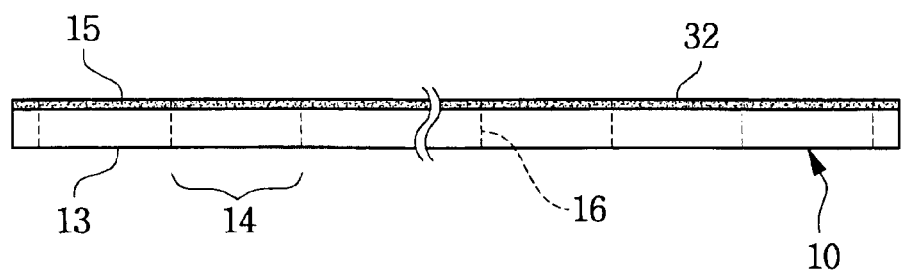

As illustrated in FIG. 5, a B-stage adhesive layer 32 may then be formed on the semiconductor wafer backside 15 (step 83 of FIG. 1) by applying a liquid organic adhesive to the semiconductor wafer backside. The B-stage adhesive layer 32 may be selected to have a CTE that is similar to that of the passivation layer 19. The liquid organic adhesive layer formed on the semiconductor wafer backside 15 may then be cured to form a B-stage adhesive layer having a predetermined thickness.

The formation of a B-stage adhesive layer 32 having a CTE approaching that of the passivation layer 19 may tend to reduce or eliminate warping of the semiconductor wafer. The warping may also result from stresses applied to the semiconductor wafer when the passivation layer material tends to shrink as it solidifies from liquid. Likewise, when an organic adhesive having similar CTE to the passivation layer is applied to the semiconductor wafer backside and cured, opposite stresses of similar magnitude may be applied to the semiconductor layer as the organic adhesive is cured and shrinks, on the semiconductor wafer backside 15. Thus, by tending to counterbalance the stresses induced by the passivation layer, the backside adhesive may be used to reduce or eliminate warping of the semiconductor wafers.

The B-stage adhesive layer 32 may be formed by a variety of application methods including, for example, spin coating, printing, injection molding or compression molding. After forming, the initial adhesive layer may be subjected to a curing process sufficient to achieve a B-stage cure of the adhesive including, for example, heating the adhesive to a temperature of 100° C. to 150° C. for a period of about 20 to 30 minutes. Alternatively, the B-stage adhesive layer 32 may be formed by exposing the initial adhesive layer to ultraviolet (UV) light energy at an intensity and for a duration sufficient to achieve the desired B-stage cure.

The organic adhesive may comprise a single organic chemical, such as epoxy, acryl, polyimide or silicone, or a complex organic compound consisting of organic chemicals, for example, epoxy/acryl, epoxy/polyimide, epoxy/silicone, acryl/polyimide, polyimide/silicone or epoxy/polyimide/silicone adhesive compositions. Although organic adhesive in other viscosity ranges may be used in practicing the invention, it is believed that organic adhesives having a viscosity within a range of from about 20 to 30 poise may be particularly useful for application to the semiconductor wafer. It is expected that the B-stage adhesive layer 32 may typically have an average thickness of between about 30 $\mu$m to 50 $\mu$m, but it will be appreciated that this thickness may be adjusted depending on variety of factors including, for example, the thickness of the backlapped wafer 10, the shrinkage and CTE performance of the passivation layer 19 and the shrinkage and CTE performance of the selected adhesive.

Figure 6:
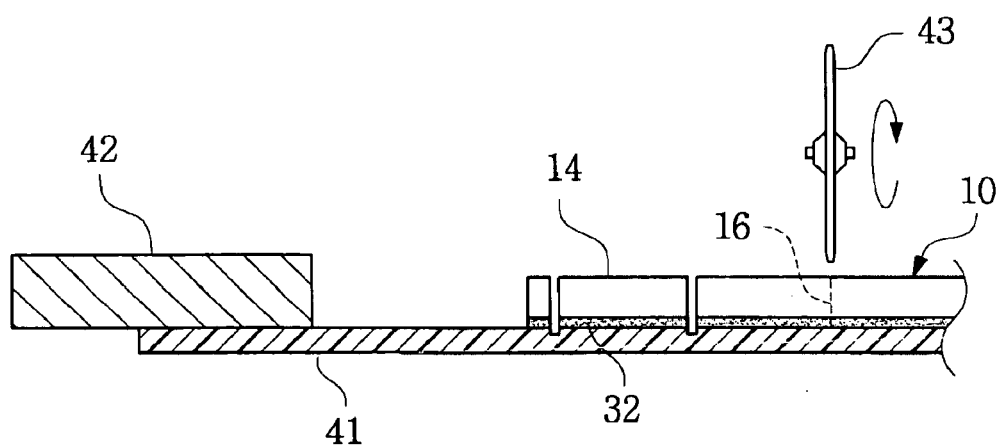

As illustrated in FIG. 6, the semiconductor wafer 10, with the B-stage adhesive layer 32 formed on the backside surface 15 may then be divided into individual semiconductor chips 14 (step 84 of FIG. 1). The semiconductor wafer 10 having the B-stage adhesive layer 32 is attached to a sawing tape 41. The sawing tape 41 is, in turn, attached to a wafer ring 42. The semiconductor wafer 10 may then be sawn along scribe lines 16 by a wafer cutter 43 to separate the individual semiconductor chips 14. The wafer cutter is configured to saw through both the semiconductor wafer and the B-stage adhesive layer 32. As will be appreciated by those of ordinary skill in the art, as an alternative to the disclosed sawing method, the semiconductor wafer 10 may be supported on a vacuum stage (not shown) during the sawing operation, thereby avoiding the use of the sawing tape and wafer ring assembly.

Figure 7:
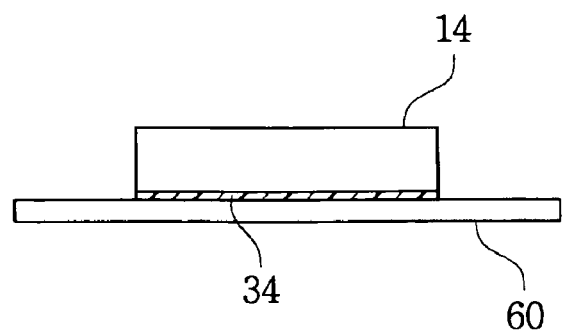

As illustrated in FIG. 7, an individual semiconductor chip 14 with its corresponding portion of the B-stage adhesive layer 32 can then be separated from its adjacent semiconductor chips and attached to a circuit substrate 60 (step 85 of FIG. 1). The circuit substrate 60 may be selected from a number of substrates upon which a semiconductor chip may be mounted including, for example, lead frames, tape wiring substrates, printed circuit boards and ceramic substrates.

A chip transferring apparatus (not shown) absorbs the semiconductor chip 14 to separate the semiconductor chip from the sawing tape 41 and then attach the semiconductor chip to a predetermined region the circuit substrate 60 (step 85a of FIG. 1). The circuit substrate 60 and the attached semiconductor chip 14 may then be moved into an oven wherein the B-stage adhesive layer 32 is cured to form a C-stage adhesive layer 34, thereby increasing the strength of the attachment between the semiconductor chip and the circuit substrate (step 85b of FIG. 1). The C-stage curing process may, for example, be conducted at a temperature of about 150° C. to 200° C. for a duration of between about 30 to 60 minutes.

By utilizing an embodiment of the exemplary process described above, the need for additional adhesive means for attaching the semiconductor chip 14 to the circuit substrate 60 may be eliminated. For example, an appropriate B-stage adhesive layer 32 formed on the semiconductor chip 14 may allow direct attachment of the semiconductor chip 14 to the circuit substrate 60, thereby avoiding the need to apply a separate resin paste adhesive between the semiconductor chip and the circuit substrate. Further, the use of the B-stage adhesive layer 32 according to the invention, in addition to reducing or eliminating the need for an additional resin paste adhesive, may reduce or eliminate chipping faults during the handling of semiconductor chips. Once the semiconductor chip 14 is mounted on the circuit substrate 60, conventional semiconductor device manufacturing processes may be used to complete the production of the final semiconductor device package.

Figure 8:
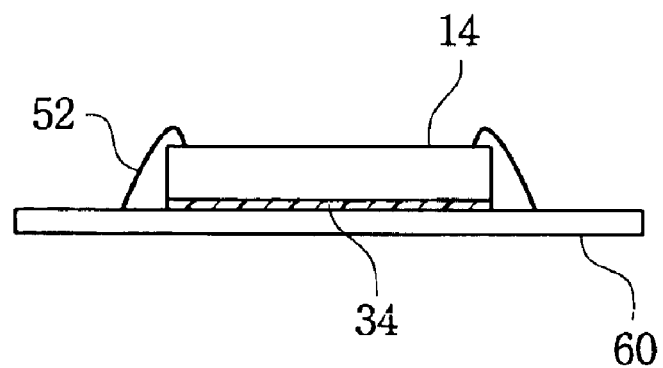
Figure 9:
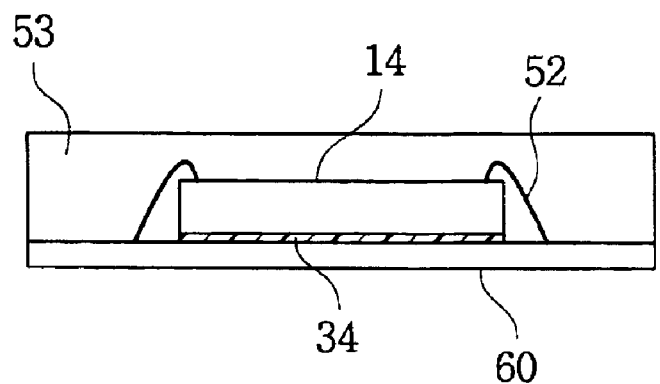
Figure 10:
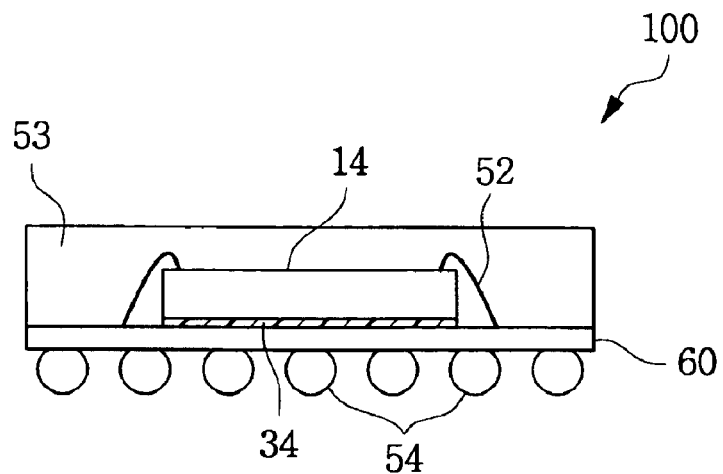

As illustrated in FIG. 8, the semiconductor chip 14 may be electrically connected to the circuit substrate 60 using bonding wires 52 (step 86 of FIG. 1) after which, as illustrated in FIG. 9, a resin encapsulant 53 may be formed to protect the semiconductor chip 14 and the bonding wires 52 from the external environment. As illustrated in FIG. 10, solder balls 54 may be formed on the lower surface of the circuit substrate 60 using a variety of conventional methods including, for example, ball placement, plating, stencil printing or metal jet methods. As an alternative to the solder balls 54, conductive bumps may be formed on the lower surface of the circuit substrate, typically including nickel (Ni), gold (Au) or alloys thereof.

Figure 11:
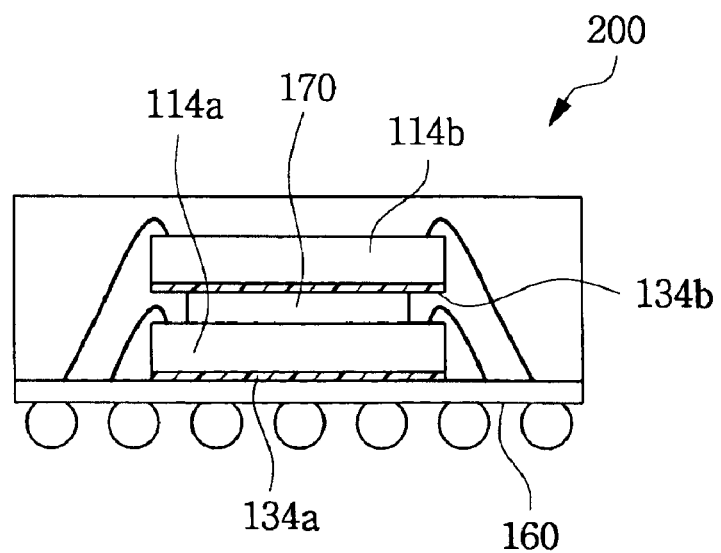
FIG. 11 is a cross-sectional view illustrating two semiconductor chips vertically stacked on the circuit substrate in accordance with a second exemplary embodiment of the present invention.
Figure 12:
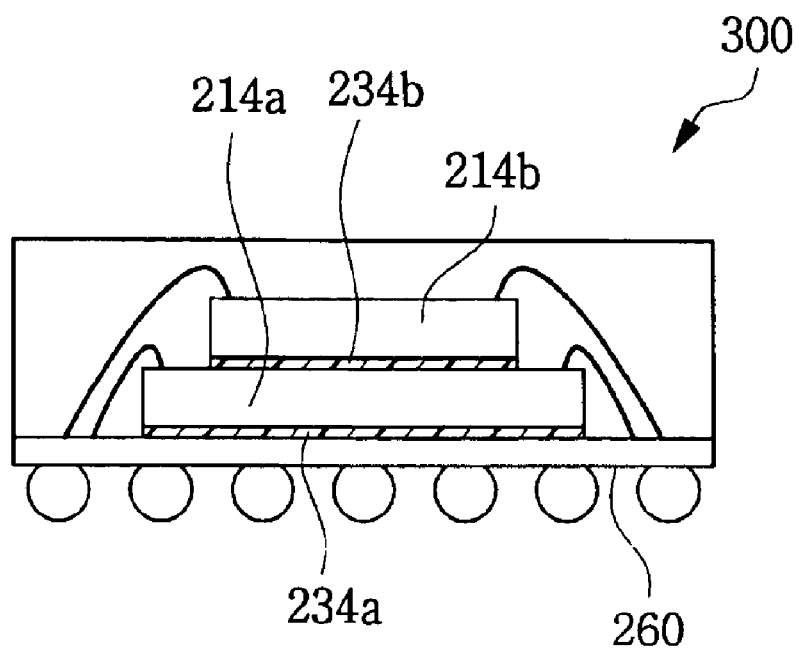
FIG. 12 is a cross-sectional view illustrating two semiconductor chips vertically stacked on the circuit substrate in accordance with a third exemplary embodiment of the present invention.

Although this embodiment shows a single chip package having a single semiconductor chip 14, e.g., "n"=1 in "Attaching the n chip(s) completed?" (step 87 of FIG. 1), multi-chip packages having at least two semiconductor chips may be manufactured in a similar fashion. For example, the exemplary embodiments illustrated in FIGS. 11 and 12 illustrate a semiconductor device having two semiconductor chips arranged in a vertical stack. For convenience in describing these exemplary embodiments, the lower semiconductor chip, i.e., the semiconductor chip that is attached to the circuit substrate, is designated as the first chip. The upper semiconductor chip, i.e., the semiconductor chip that is attached to the first chip is designated as the second chip.

As illustrated in FIG. 11, a semiconductor device 200 includes a first chip 114a and a second chip 114b in which the first and second chips are approximately the same size. A spacer 170 may be positioned between the first chip 114a and the second chip 114b to reduce the likelihood that the second chip will damage or otherwise interfere with the bonding wires connected between the first chip and the circuit substrate 160. Using the B-stage adhesive layers, the first chip 114a and the second chip 114b are attached to the circuit substrate 160 and the spacer 170, respectively, without the need for additional resin paste adhesive. The respective B-stage adhesive layers are then cured to form C-stage adhesive layers 134a and 134b.

Figure 13A:
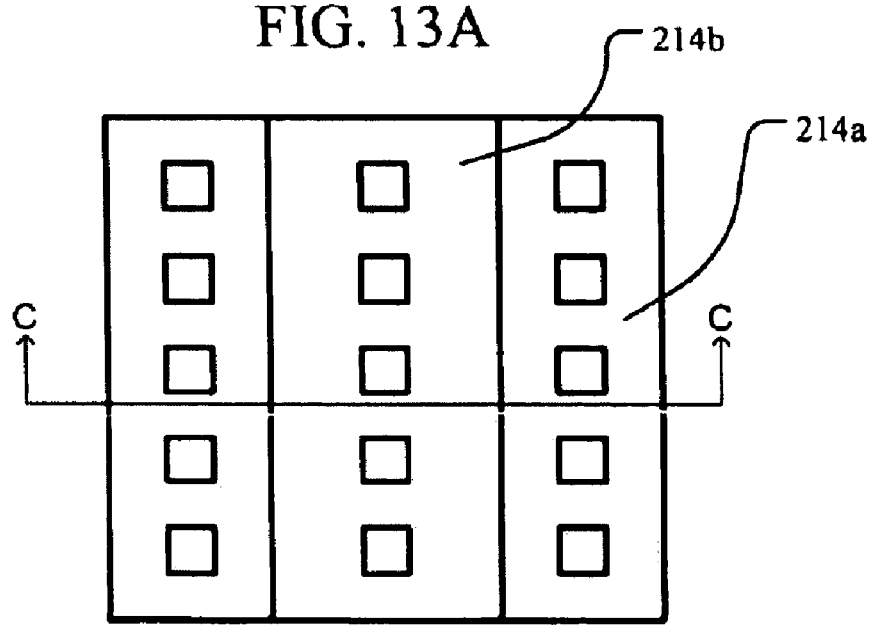
FIGS. 13A and 13B illustrate embodiments according to FIG. 12 in which the second semiconductor chip is contained within the periphery of the first semiconductor chip either substantially.
Figure 13B:
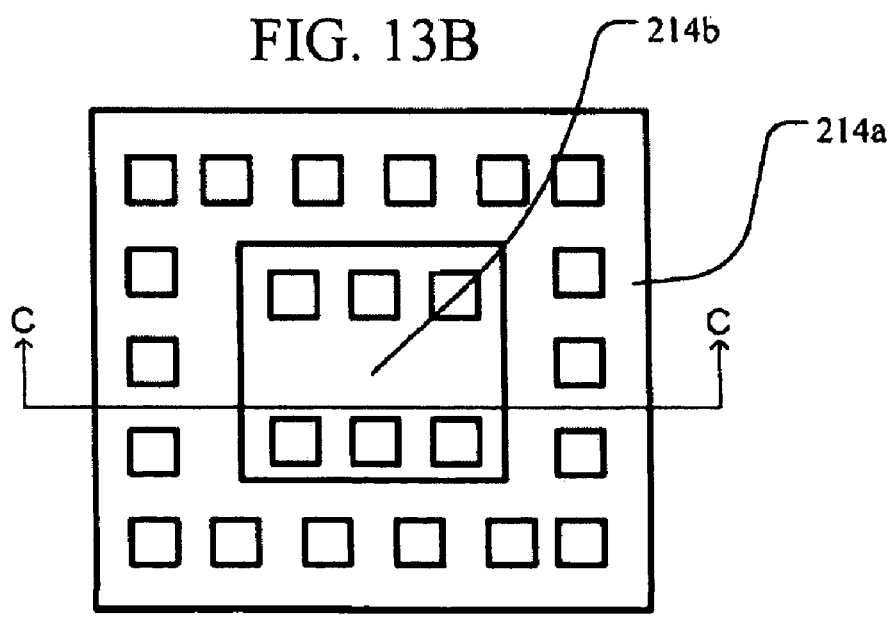

As illustrated in FIG. 12, a semiconductor device 300 includes a first chip 214a and a second chip 214b in which the first chip is significantly larger than the second chip. Using the B-stage adhesive layers, the first chip 214a and the second chip 214b may be attached to the circuit substrate 260 and the first chip 214a, respectively, without requiring the use of additional resin paste adhesive. The B-stage adhesive layers may then be cured to form C-stage adhesive layers 234a and 234b. As illustrated in FIGS. 13A and 13B, depending on the configuration of the bonding pads on the first and second semiconductor chips and the relative sizing of the first and second semiconductor chips, the second semiconductor chip 214b may be contained substantially, FIG. 13A, or completely, FIG. 13B, within the periphery of the first semiconductor chip 214a.

The exemplary methods for manufacturing the semiconductor devices 200 and 300 include the sequence of operations outlined in FIG. 1. In the embodiments illustrated in FIGS. 11 and 12, for example, "n" would be "2" at the decision point "Attaching the n chip(s) completed?" (step 87 of FIG. 1). The method for manufacturing the semiconductor device 200 may further comprise a step of attaching the spacer 170 to the active surface of the first chip 114a before attaching the second chip 114b.

Accordingly, the exemplary embodiments of the invention include an adhesive layer formed on the backside of a wafer after a backlapping process has been completed, thereby reducing or preventing the warping of the semiconductor wafer induced by the passivation layer. Further, the exemplary embodiments of the present invention provide a process for attaching semiconductor chips to circuit substrates without using a separate resin paste adhesive, thereby avoiding process and reliability issues associated with the use of a resin paste adhesive, simplifying the process, and improving productivity.

The exemplary embodiments of the invention also provide a B-stage adhesive layer that adds a degree of protection to the semiconductor wafer backside, thereby reducing the likelihood of damage such as chips and cracks that may be caused by handling after the backlapping and/or sawing processes. And finally, the exemplary embodiments of the invention provide the ability to form a stack of semiconductor chips without requiring the use of a resin paste adhesive.

Although the exemplary embodiments of the present invention have been described in detail hereinabove, it should be understood that many variations and/or modifications of the basic inventive concepts herein taught, which may appear to those skilled in the art, will still fall within the spirit and scope of the present invention as defined in the appended claims.

What is claimed is:

1. A method for manufacturing semiconductor devices comprising:
    forming an array of semiconductor chips on an active surface of a semiconductor wafer, the semiconductor wafer also including a backside surface and having an initial thickness;
    removing a portion of the initial thickness of the semiconductor wafer from the backside surface to form a thinned semiconductor wafer having a secondary backside surface;
    applying an organic adhesive layer to the secondary backside surface;
    curing the layer of organic adhesive to form a B-stage adhesive layer;
    sawing the thinned semiconductor substrate and the B-stage adhesive layer to separate the array of semiconductor chips into a plurality of individual semiconductor chips, each of the individual semiconductor chips including a portion of the B-stage adhesive layer;
    attaching one of the individual semiconductor chips to a circuit substrate using the portion of the B-stage adhesive layer; and
    curing the portion of the B-stage adhesive layer to form a C-stage adhesive portion.

2. A method for manufacturing semiconductor devices according to claim 1, wherein:
    for semiconductor wafers having a diameter of about 250 mm or less, the thinned semiconductor wafers have a thickness no greater than about 200 $\mu$m; and
    for semiconductor wafers having a diameter of more than about 250 mm, the thinned semiconductor wafers have a thickness no greater than about 400 $\mu$m.

3. A method for manufacturing semiconductor devices according to claim 1, wherein the organic adhesive is selected from a group of adhesives consisting of epoxy, acryl, polyimide, silicone, epoxy/acryl, epoxy/polyimide, epoxy/silicone, acryl/polyimide, polyimide/silicone and epoxy/polyimide/silicone.

4. A method for manufacturing semiconductor devices according to claim 3, wherein the organic adhesive layer is formed by a method selected from a group consisting of spin coating, printing, injection molding and compression molding methods.

5. A method for manufacturing semiconductor devices according to claim 3, wherein curing the organic adhesive layer includes:
    heating the organic adhesive layer to a B-curing temperature; and
    maintaining the B-curing temperature for a B-curing time sufficient to convert the organic adhesive layer substantially completely into the B-stage adhesive layer.

6. A method for manufacturing semiconductor devices according to claim 5, wherein:
    the B-curing temperature is between about 100° C. to about 150° C.; and
    the B-curing time is between about 20 and about 30 minutes.

7. A method for manufacturing semiconductor devices according to claim 4, wherein curing the organic adhesive layer includes:
    exposing the organic adhesive layer to ultraviolet light of sufficient intensity and duration to convert the organic adhesive layer substantially completely into the B-stage adhesive layer.

8. A method for manufacturing semiconductor devices according to claim 3, wherein the B-stage adhesive layer has an average thickness of between about 30 $\mu$m and 50 $\mu$m.

9. A method for manufacturing semiconductor devices according to claim 3, wherein the organic adhesive has a viscosity of 20 to 30 poise as it is applied to the secondary backside surface.

10. A method for manufacturing semiconductor devices according to claim 1, wherein curing the portion of the B-stage adhesive layer includes:
    heating the portion of the B-stage adhesive layer to a C-curing temperature; and
    maintaining the portion of the B-stage adhesive layer at the C-curing temperature for a C-curing time sufficient to convert the portion of the B-stage adhesive layer substantially completely into the C-stage adhesive portion.

11. A method for manufacturing semiconductor devices according to claim 10, wherein:
    the C-curing temperature is within a range from about 150° C. to about 200° C.; and
    the C-curing time is between about 30 minutes and about 60 minutes.

12. A method for manufacturing semiconductor devices comprising:
    forming an array of first semiconductor chips on an active surface of a first semiconductor wafer, the first semiconductor wafer also including a backside surface and having an initial thickness;
    removing a portion of the initial thickness of the first semiconductor wafer from the backside surface to form a first thinned semiconductor wafer having a secondary backside surface;
    applying a first organic adhesive layer to the secondary backside surface of the first thinned semiconductor wafer;
    curing the layer of organic adhesive to form a first B-stage adhesive layer;
    sawing the first thinned semiconductor substrate and the B-stage adhesive layer to separate the array of first semiconductor chips into a plurality of individual first semiconductor chips, each of the individual first semiconductor chips including an active surface and a backside surface and a portion of the first B-stage adhesive layer on the backside surface;
    attaching one of the individual first semiconductor chips to a circuit substrate using the portion of the first B-stage adhesive layer;
    curing the portion of the first B-stage adhesive layer to form a first C-stage adhesive portion
    forming an array of second semiconductor chips on an active surface of a second semiconductor wafer, the second semiconductor wafer also including a backside surface and having an initial thickness;
    removing a portion of the initial thickness of the second semiconductor wafer from the backside surface to form a second thinned semiconductor wafer having a secondary backside surface;

applying a second organic adhesive layer to the secondary backside surface of the second thinned semiconductor wafer;

curing the second layer of organic adhesive to form a second B-stage adhesive layer;

sawing the second thinned semiconductor substrate and the second B-stage adhesive layer to separate the array of second semiconductor chips into a plurality of individual second semiconductor chips, each of the individual second semiconductor chips including a portion of the second B-stage adhesive layer;

attaching one of the individual second semiconductor chips to the first semiconductor chip; and curing the portion of the first B-stage adhesive layer to form a first C-stage adhesive portions.

13. A method for manufacturing semiconductor devices according to claim 12, wherein attaching one of the individual second semiconductor chips to the first semiconductor chip includes:

attaching a spacer to the active surface of the first semiconductor chip; and attaching the second semiconductor chip to an upper surface of the spacer.

14. A method for manufacturing semiconductor devices according to claim 12, wherein the second semiconductor chip is attached to the first semiconductor chip by heat compression.

15. A method for manufacturing semiconductor devices according to claim 12, wherein the second semiconductor chip is attached to the top surface of the spacer after the first C-stage adhesive portion has been formed.

16. A method for manufacturing semiconductor devices according to claim 13, wherein the second semiconductor chip is attached to the top surface of the spacer after the C-stage adhesive portion has been formed.

17. A method for manufacturing semiconductor devices according to claim 13, wherein the second semiconductor chip is attached to the top surface of the spacer before the first C-stage adhesive portion has been formed, whereby curing the portion of the first B-stage adhesive layer to form the first C-stage adhesive portion also converts the portion of the second B-stage adhesive layer substantially completely into a second C-stage adhesive region.

18. A method for manufacturing semiconductor devices according to claim 13, wherein:

the active surface of the first semiconductor chip and the active surface of the second semiconductor chip have approximately the same dimensions.

19. A method for manufacturing semiconductor devices according to claim 12, wherein:

the active surface of the first semiconductor chip defines a first periphery; and the active surface of the second semiconductor chip defines a second periphery, wherein the second periphery is be contained substantially within the first periphery when the second semiconductor chip is mounted on the first semiconductor chip.

20. A method for manufacturing semiconductor devices according to claim 19, wherein:

the second periphery is contained completely within the first periphery when the second semiconductor chip is mounted on the first semiconductor chip.

* * * * *